US008746085B2

(12) United States Patent
Singh et al.

(10) Patent No.: US 8,746,085 B2
(45) Date of Patent: Jun. 10, 2014

(54) METHOD AND APPARATUS FOR MEASURING CONTAINER BULGE

(75) Inventors: Jay Singh, San Luis Obispo, CA (US); William Kutz, San Luis Obispo, CA (US)

(73) Assignee: Cal Poly Corporation, San Luis Obispo, CA (US)

( * ) Notice: Subject to any disclaimer, the term of this patent is extended or adjusted under 35 U.S.C. 154(b) by 517 days.

(21) Appl. No.: 13/227,124

(22) Filed: Sep. 7, 2011

(65) Prior Publication Data

US 2013/0057268 A1 Mar. 7, 2013

(51) Int. Cl.
*G01L 1/26* (2006.01)

(52) U.S. Cl.
USPC .................... 73/862.391; 73/862.637

(58) Field of Classification Search
CPC .......... G01B 15/04; G01B 7/281; G01N 2203/0282; G01M 3/04; B21D 26/049
USPC ........... 73/49.3, 159, 149, 862.381, 862.391, 73/862.392, 862.632, 862.637
See application file for complete search history.

(56) References Cited

U.S. PATENT DOCUMENTS

| | | | | |
|---|---|---|---|---|
| 2,355,051 | A * | 8/1944 | Braucher | 209/597 |
| 3,008,328 | A | 11/1961 | Cope et al. | |
| 3,214,838 | A | 11/1965 | Skundberger | |
| 5,325,723 | A * | 7/1994 | Meadows et al. | 73/794 |
| 5,868,030 | A * | 2/1999 | Brumley et al. | 73/784 |
| 6,050,138 | A * | 4/2000 | Lynch et al. | 73/150 A |
| 6,321,594 | B1 * | 11/2001 | Brown et al. | 73/150 A |
| 6,539,790 | B2 * | 4/2003 | Huston et al. | 73/150 A |
| 6,772,642 | B2 * | 8/2004 | Hajduk et al. | 506/12 |
| 7,409,848 | B2 * | 8/2008 | Petrinic et al. | 73/12.08 |

OTHER PUBLICATIONS

Dro Pros, Digital Readout Experts, www,dropros.com downloaded Aug. 15, 2011.
Electronica (MG232 Magna) IP67 Enclosed Linear Measuring System, downloaded form www.electronicaems.co.uk Aug. 27, 2011.
ISO/FDIS 3394 Packaging—Complete, filled transport packages and unit loads—Dimensions of rigid rectangular packages, copyright 2011.
ISO/FDIS 3676 Packaging—Complete, filled transport packages and unit loads—Unit load dimensions, copyright 2011.

* cited by examiner

*Primary Examiner* — Max Noori
(74) *Attorney, Agent, or Firm* — SoCal IP Law Group LLP; Mark A. Goldstein (57) ABSTRACT

An extensible frame adapted to receive and maintain a rectilinear container applied upon an interior ledge extensible frame. Two or more orthogonally aligned sensor assemblies are provided to measure deflection of panels forming the container when a static or dynamic load is applied upon an uppermost panel. Each sensor assembly outputs a signal corresponding to a deflection of a panel induced by the load applied upon the uppermost panel. Signals output from the sensor assemblies are received and processed by an output processing unit in either a human cognizable or machine readable format. The amount deflection measured by the sensor assemblies corresponds to an amount of bulge of a panel when a defined load is applied.

28 Claims, 8 Drawing Sheets

METHOD AND APPARATUS FOR MEASURING CONTAINER BULGE

CROSS-REFERENCE TO RELATED APPLICATIONS

Not applicable

STATEMENT OF GOVERNMENT INTEREST

Not applicable

RELEVANT FIELD

This application is directed generally toward containers and more specifically toward container response under load.

RELEVANT ART

Containers are used in a wide variety of applications for transportation and storage of wide variety of products including but not limited to industrial, commercial, consumer, government and agricultural uses. The construction of the containers should be sufficient to maintain the products without damage. In many instances, containers are aggregated onto pallets for convenience in transportation and storage. In such instances, containers having superjacent and adjacent containers may become deformed due to compressive forces induced upon one or more container walls. The amount of deformation affects both the ability to protect the contents of the containers and also influences packing densities upon a pallet. Accordingly, there is need in the relevant art to determine the extent of container deformation under load.

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

SUMMARY

In view of the foregoing, various inventive embodiments for measuring container bulge are described. In an inventive embodiment, an extensible frame is provided. The extensible frame is extensible in at least two axes to allow for bulge measurements of various sizes of containers. In some inventive embodiments, the extensible frame includes an interior ledge dimensioned to maintain the container in a snug fit relationship within a rectilinear aperture formed by the extensible frame. The interior ledge may be disposed along the periphery of the rectilinear aperture.

Sensor assemblies may be coupled to the extensible frame to measure container bulging along the two or more axes. The sensor assemblies are typically positioned in communication with about centroidal areas of panels forming the container and are adapted to output signals corresponding to measured deflections induced applied upon the panels by an external load applied upon the container. The measured deflections represent bulging of the container at least at the centroidal areas of the panels when the external load is applied to a panel of the container. An output processing unit is operatively coupled to the plurality of sensor assemblies for converting the output signals to either of a human cognizable format or a machine readable format.

In an inventive embodiment, the extensible frame may be formed from a set of beams, each of the beams being slidably or repositionably coupled at about one end with a longitudinal slot of another beam aligned orthogonally to the slidably coupled beam. Additional beams may be provided to form the rectilinear aperture to fully encompass an outer periphery of the container without causing substantial interference with the measured deflections.

In an inventive embodiment, each of the sensor assemblies include a platen which is used to abut against a panel of the container in a face-to-face relationship such that a deflection of the panel induces displacement of the platen and a sensor for converting the displacement of the platen into a signal readable by the output processing unit. In some inventive embodiments, the platen is abutted against the panel of the container at about the panel's centroid. In various inventive embodiments, the container may be a corrugated fiberboard container, a metal container and a plastic container.

Measurements of container bulge may be performed using any of the above described inventive embodiments by adjusting the extensible frame to snuggly fit against an exterior periphery of a container while a bottom panel of the container maintains uniform contact with the ledge. A load is then uniformly applied upon a top panel opposite the bottom panel. Bulging of the container induced by the load may then be measured along two or more axes simultaneously.

BRIEF DESCRIPTION OF DRAWINGS

The features and advantages of the various inventive embodiments will become apparent from the following detailed description when considered in conjunction with the accompanying drawings. Where possible, the same reference numerals and characters are used to denote like features, elements, components or portions of the inventive embodiments. It is intended that changes and modifications can be made to the described embodiments without departing from the true scope and spirit of the inventive embodiments as is defined by the claims.

DETAILED DESCRIPTION

Various inventive embodiments of a method and apparatus for measuring container bulge are disclosed herein. In the following detailed description, numerous specific details are set forth in order to provide a thorough understanding of the present inventive embodiments. It will be apparent, however, to one skilled in the art that the present inventive embodiments may be practiced without these specific details. In other instances, well-known structures, construction materials and/or shapes may be shown in block diagram form in order to avoid unnecessarily obscuring the present inventive embodiments.

Container bulge is a well known packaging phenomenon for which an industry-wide accepted apparatus and method for measuring container bulge has not been established. As a result, there is a general lack of knowledge about the physical characteristics of container bulge and its effect on a container's structural integrity. The bulge measurement apparatus disclosed herein provides an accurate and reproducible platform and method for precisely measuring and evaluating container bulge in a way that was previously unavailable.

Figure 1:
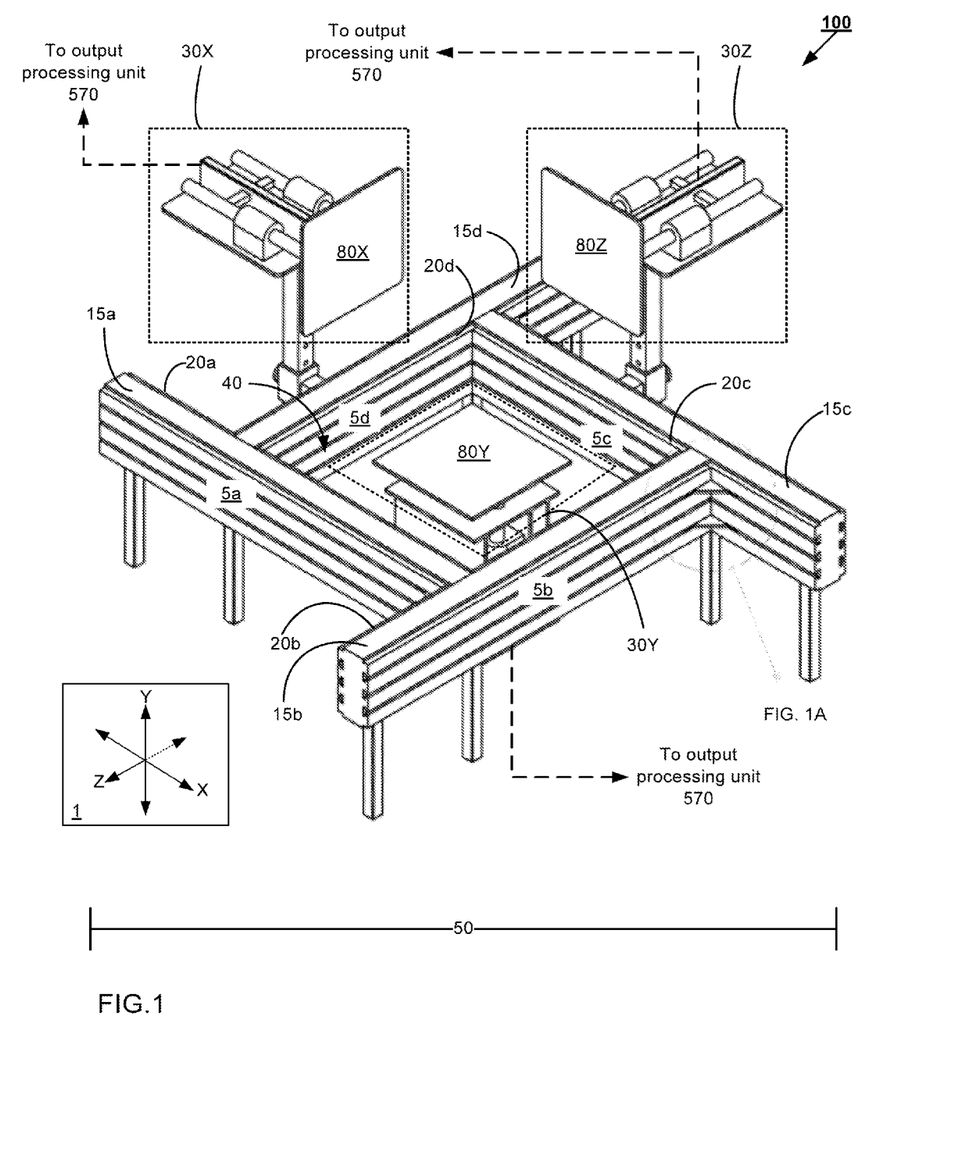
FIG. 1—depicts a perspective view of a bulge measurement apparatus in accordance with an inventive embodiment.

Referring to FIG. 1, a perspective view of a bulge measurement apparatus 100 in accordance with an inventive embodiment is depicted. In an inventive embodiment, the bulge measurement apparatus 100 includes an extensible frame 50 and two or more sensor assemblies 30X, 30Z and/or 30Y which measure deflection of two or panels of a container 500 (FIG. 5) supported upon the extensible frame 50 when an external load is applied upon the container. Each of the sensor assemblies 30X, 30Z and/or 30Y include platens 80X, 80Y, 80Z which abut against orthogonal panels of the container during bulge measurement.

In some inventive embodiments, the extensible frame 50 is formed from a set of beams 5a, 5b, 5c, 5d arranged such that each adjacent beam is orthogonally aligned to form a rectilinear 40 aperture encompassed by the extensible frame 50. In some such embodiments, each beam 5a, 5b, 5c, 5d includes a longitudinally aligned section 15a, 15b, 15c, 15d attached to a top face thereof. The sections 15a, 15b, 15c, 15d form a ledge 20a, 20b, 20c, 20d applied upon the top of the beams 5a, 5b, 5c, 5d. The ledge 20a, 20b, 20c, 20d is dimensioned to maintain a bottom (lower) panel of a container 500 in face-to-face relationship with an outer periphery of the bottom and side (upright) panels of the container 500 without substantially interfering with biaxial or triaxial bulge measurements. In an inventive embodiment, the ledge 20a, 20b, 20c, 20d forms a support surface for a perimeter of the container 500 to rest upon. In this inventive embodiment, the ledge 20a, 20b, 20c, 20d is configured to provide a recessed lip for the container to fit snugly inside. This arrangement prevents the container 500 from shifting on the frame 50 during bulge measurement.

The ledge dimension should remain consistent for each bulge measurement irrespective of changes in the dimensions of the rectilinear aperture 40. In an inventive embodiment, the ledge 20a, 20b, 20c, 20d is formed from a stack of aluminum strip bar stock affixed to the top of the frame 50. Each aluminum strip allows the ledge 20a, 20b, 20c, 20d to properly dovetail forming an extensible and consistent 0.5 inch support surface which defines the perimeter of the rectilinear aperture 40.

One skilled in the art will appreciate that the apparatus 100 may be scaled to accommodate other container dimensions. Resizing of the frame 50 maintains a constant contact surface of about 0.5 inch with a bottom (lower) panel of a container 503 (FIG. 5) irrespective of the dimensions of the container 500.

Bulge measurements are accomplished using the two or more sensor assemblies 30X, 30Z and/or 30Y. In an inventive embodiment, the two or more sensor assemblies 30X, 30Z and/or 30Y are aligned along X, Y and/or Z axes (biaxial or triaxial) of a container 500 undergoing bulge testing. For purposes of illustration, triaxial orientations 1 are used for consistency throughout this specification. The triaxial orientation is set forth with the X-axis spanning left and right orientations, the Y-axis spanning top and bottom orientations, and the Z-axis spanning front and back orientations. A more thorough discussion of the two or more sensor assemblies 30X, 30Z and/or 30Y is provided in the discussion accompanying FIGS. 4A and 4B.

Figure 1A:
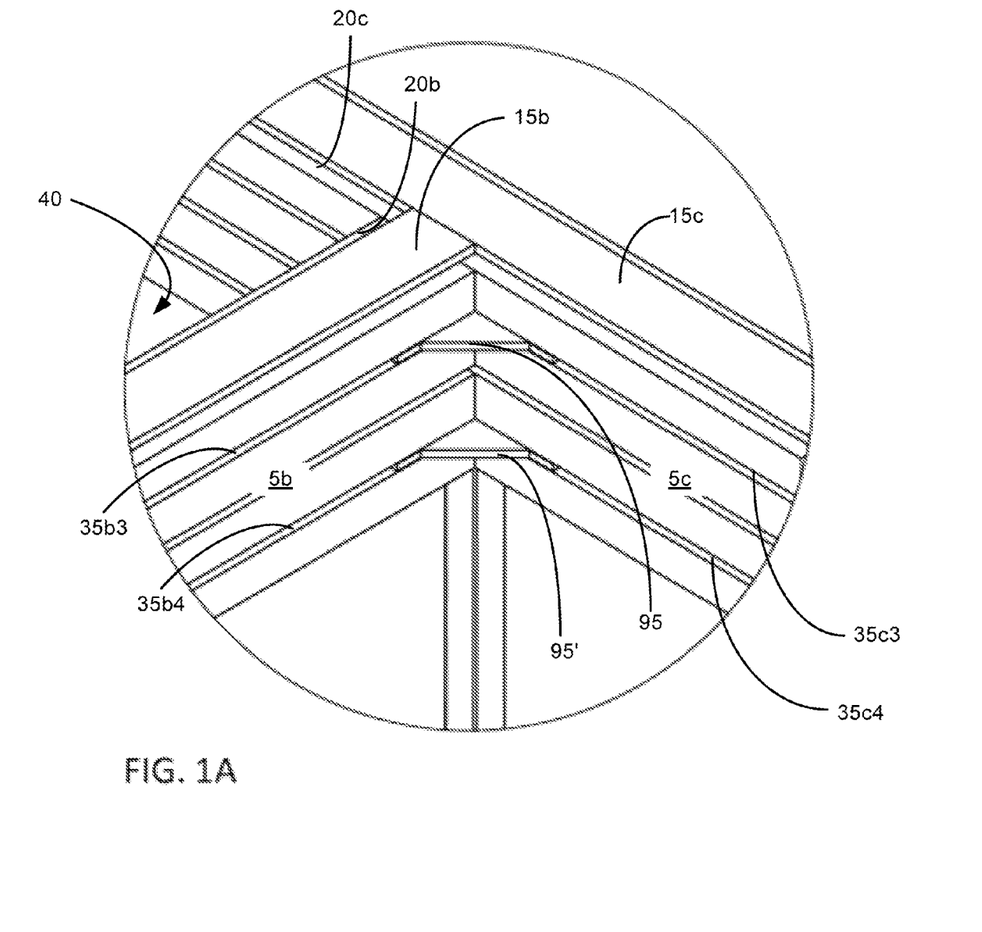
FIG. 1A—depicts a close-up perspective view of a frame locking mechanism in accordance with an inventive embodiment.

Referring to FIG. 1A, a close-up perspective view of a frame locking mechanism 95, 95' in accordance with an inventive embodiment is depicted. In an embodiment, the beams 5a, 5b, 5c, 5d forming the frame 50 shown in FIG. 1 include an interior pair of longitudinal T-channels 35b3, 35b4, 35c3, 35c4 which allows adjacent orthogonally aligned beams to be slidably repositioned to accommodate various container sizes. In some such inventive embodiments, the beams 5a, 5b, 5c, 5d may be constructed using 3060 precision extrude aluminum.

The longitudinal T-channels 35b3, 35b4, 35c3, 35c4 of the beams 5a, 5b, 5c, 5d slidably receive locking members 95, 95' positioned to retain a particular geometry associated with a container shape. In an inventive embodiment, the locking members 95, 95' include an L-shape side profile with a width approximating a width of a broad dimension of the T-channels 35b3, 35b4, 35c3, 35c4 and a protrusion dimensioned to fit within a narrow dimension of the T-channels 35b3, 35b4, 35c3, 35c4. The locking members 95, 95' may be held in place against inner walls of the T-channels 35b3, 35b4, 35c3, 35c4 using fasteners which wedge the locking members 95, 95' within the T-channels 35b3, 35b4, 35c3, 35c4.

One skilled in the art will appreciate that other mechanisms may be used to maintain the beams 5a, 5b, 5c, 5d in a particular orientation. By way of example and not limitation, each beam 5a, 5b, 5c, 5d may be constructed with a longitudinal slot. A threaded projection on one end of each beam may extend perpendicularly through the slot. A threaded hand wheel or lever may then be tightened to lock each beam in a particular orientation (not shown). Other arrangements not discussed may likewise be implemented to accomplish a particular design objective.

Figure 2:
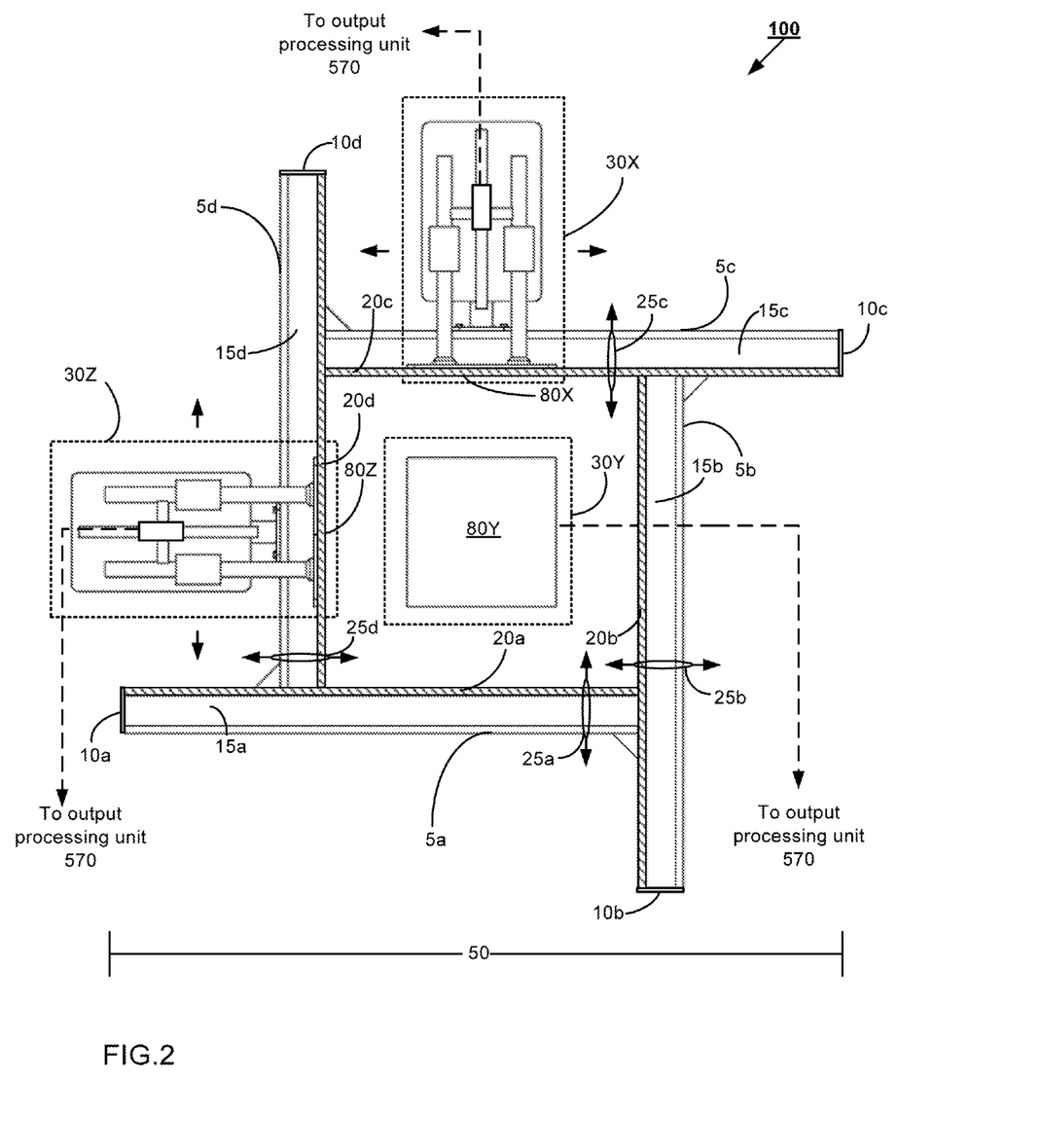
FIG. 2—depicts a top view of a bulge measurement apparatus in accordance with an inventive embodiment.

Referring to FIG. 2, a top view of a bulge measurement apparatus 100 in accordance with an inventive embodiment is depicted. In this inventive embodiment, the frame 50 is constructed from four orthogonally aligned beams 5a, 5b, 5c, 5d. Each beam 5a, 5b, 5c, 5d is slidably repositionable along a long axis 25a, 25b, 25c, 25d of an adjacent orthogonally aligned beam at a proximal end. End of travel end caps 10a, 10b, 10c, 10d are provided at distal ends of each beam 5a, 5b, 5c, 5d to limit extension of the frame beyond a long dimension of the beams 5a, 5b, 5c, 5d.

Typically, at least two orthogonal panels (biaxial) 501, 502 (FIG. 5) of a container 500 are measured for bulge. For example, repositionable X-axis and Z-axis sensor assemblies 30X, 30Z are repositionably coupled to the frame 50. In this example, X-axis and Z-axis sensor assemblies 30X, 30Z are repositionable along a long axis of beams 5c and 5d respectively. A container 500 undergoing bulge measurement causes sensors 445, 450 (FIG. 4A,4B) coupled with the associated the assemblies 30X, 30Z to output a signal having a functional relationship to deflection of upright (sidewall) and bottom panels 501, 502, 503 of the container 500.

Figure 5:
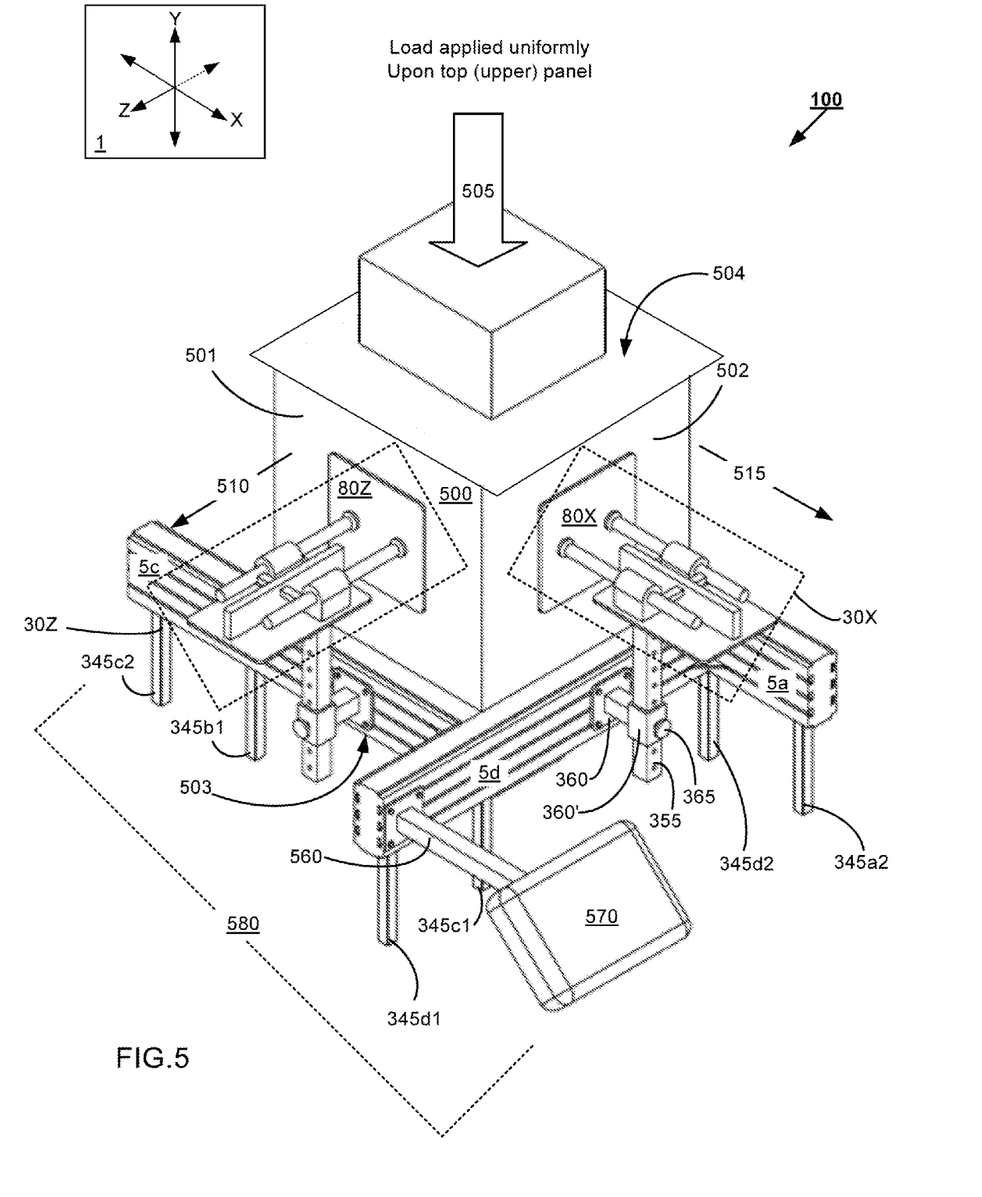
FIG. 5—depicts a perspective view of an apparatus for measuring container bulge in accordance with an inventive embodiment.

The output signal is operatively coupled to an output processing unit 570 (FIG. 5). The output processing unit 570 (FIG. 5) is described in more detail in the discussion accompanying FIG. 5.

In an inventive embodiment, a third Y-axis sensor assembly 30Y is optionally provided to measure deflection of a bottom panel 503 of the container 500. The Y-axis sensor assembly 30Y is manually positioned to measure Y-axis deflections of a bottom panel 503 of the container 500 when a uniform load 505 (FIG. 5) is applied upon a top (upper) panel 504 (FIG. 5) opposite the bottom panel 503. In either inventive embodiment, simultaneous bulge measurements may be obtained from biaxial or triaxial orientations of the container 500. This arrangement allows bulge measurement of a fully assembled container 500 to be performed to better understand how a particular container responds under load, for example to emulate response of a container in a palletized configuration (not shown.) As previously discussed, each sensor assembly 30X, 30Y, 30Z includes a platen 80X, 80Y, 80Z which is used to contact a panel 501, 502, 503 of the container 500 undergoing bulge measurement.

In this example, the X-axis and Z-axis platens 80X, 80Z are aligned such that a planar face of each platen 80X, 80Z is aligned in parallel with a vertical edge of the ledges 20a, 20b, 20c, 20d. Analogously, the Y-axis platen 80Y is aligned in parallel with horizontal edges of the ledges 20c, 20d. The platens 80X, 80Y and 80Z are intended to abut against a panel of a container without compression or deformation. In an inventive embodiment, the platens 80X, 80Y, 80Z are dimensioned to encompass an area surrounding a centroid of a container panel such that non-uniform deflection(s) of one or more of the panels is measured by the relevant sensor assembly(ies) 30X, 30Y, and/or 30Z.

Figure 3A:
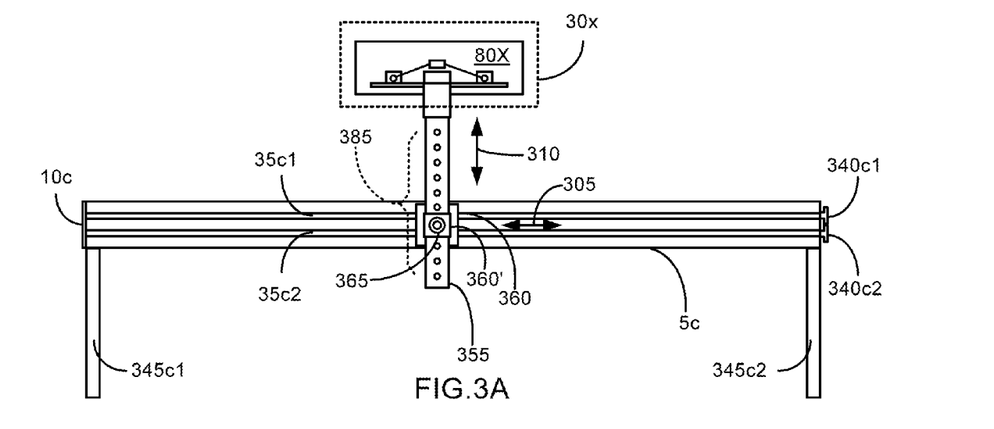
FIG. 3A—depicts a side view of a beam in accordance with an inventive embodiment is depicted.

Referring to FIG. 3A, a side plan view of a beam 5c in accordance with an inventive embodiment is depicted. In this inventive embodiment, the beam 5c includes a pair of longitudinally aligned T-channels 35c1, 35c2, a first leg 345c2 is coupled perpendicularly to the beam 5c at about the proximal end. A pair of longitudinally aligned T-fittings 340c1, 340c2 is affixed to the proximate end of the beam 5c. The T-fittings 340c1, 340c2 are dimensioned to slidably fit within a complementary pair of T-channels 35d1, 35d2 (FIG. 3C) of another beam 5b with minimal free play between the T-channels 35d1, 35d2 and the repositionably engaged T-fittings 340c1, 340c2. In an inventive embodiment, a bracket 360 is slidably coupled with the T-channels 35c1, 35c2. The bracket 360 allows a sensor assembly 30X (sensor assembly 30Z analogous) to be positioned longitudinally along the length of the beam 5c.

In one inventive embodiment, the bracket 360 includes a separate set of T-fittings which slidably engage the T-channels 35c1, 35c2 (not shown), held in a bulge measurement position with a threaded hand knob 365 inserted through one of a plurality of vertical index apertures 385 and tightened against a face of the beam 5c. In another inventive embodiment, fasteners are used to lock the bracket 360 supporting the sensor assembly 30X (30Z) in a bulge measurement position (not shown). A riser 355 slidably fits within a guide portion 360' of the bracket 360. The guide portion 360' of the bracket 360 is dimensioned to slidably receive a riser 355 therethrough for positioning of the sensor assembly 30X (30Z) along the Y-axis. The sensor assembly 30X (30Z) is coupled perpendicularly to a top end of the riser 355.

Proper positioning of the sensor assembly 30X (30Z) along the Y-axis is accomplished by raising or lowering the riser 355 within the guide portion 360' of the bracket 360 and locking the sensor assembly 30X (30Z) into position using one of the vertical index apertures 85 and a hand knob 365, pin, or bolt inserted through a selected index aperture 385 such that the platen 80X (80Z) of the sensor assembly 30X (30Z) is positioned at about a centroid of a panel 501 (502) of the container 500.

Figure 3B:
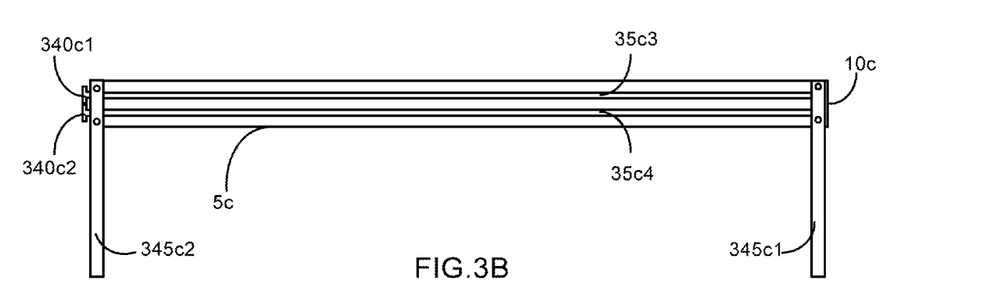
FIG. 3B—depicts a second side view of a beam in accordance with an inventive embodiment.
Figure 3C:
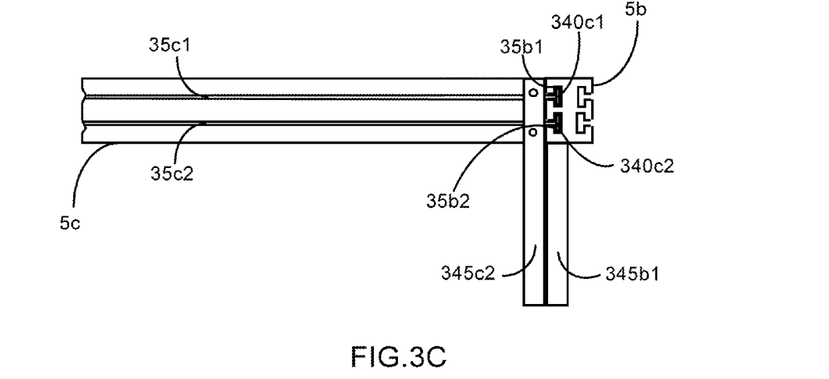
FIG. 3C—depicts a third side view of a beam in accordance with an inventive embodiment.

Referring to FIGS. 3B and 3C, second and third side views of a beam 5c in accordance with an inventive embodiment is depicted. In this inventive embodiment, the beam 5c includes a second pair of longitudinally aligned T-channels 35c3, 35c4. This view is an opposing side of the beam 5c. In this inventive embodiment, the second pair of longitudinally aligned T-channels 35c3, 35c4 receives a separate set of T-fittings from an adjacent beam 5b (FIG. 2) which slidably engages the T-channels 35c3, 35c4 to form the frame 50 as shown in FIG. 3C.

The legs 345c1, 345c2 may be perpendicularly joined with the beam 5c at about its longitudinal proximate and distal ends using fasteners, welding and/or bonding. The legs 345b21, 345c2, 345b1 may be joined to the beam 5c such that an outer longitudinal face of the leg 345c2 abuts against an adjacent orthogonal beam 5b. In such inventive embodiments, the outer longitudinal face of the leg 345c2 further minimizes movement of the beams coupled together using the T-slots 35b1, 35b2 and T-fittings 340c1, 340c2, such that precision bulge measurements may be obtained by the sensor assemblies 30X, 30Y, 30Z.

Figures 4A, 4B:
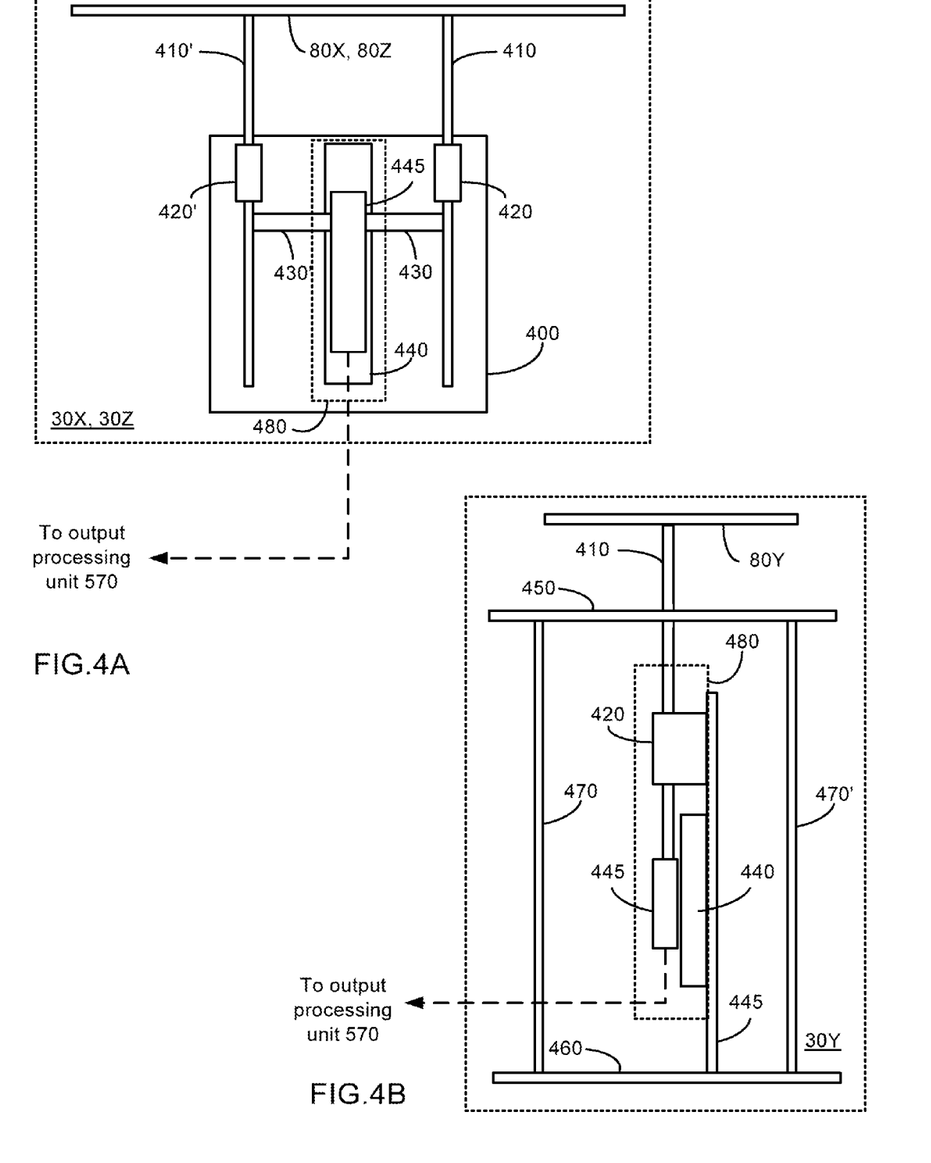
FIG. 4A—depicts a top view of a sensor assembly in accordance with an inventive embodiment.
FIG. 4B—depicts a side plan view of a sensor assembly in accordance with an inventive embodiment.

Referring to FIG. 4A, a top view of a sensor assembly 30X, 30Z in accordance with an inventive embodiment is depicted. In this inventive embodiment, sensor assemblies 30X and 30Z are substantially similar in construction and layout. For brevity, the discussion which follows refers to both sensor assemblies 30X, 30Z.

In an inventive embodiment, the X and Z axis sensor assemblies 30X, 30Z include a base support plate 400 in which the various components forming the sensor assemblies 30X, 30Z are installed. In this inventive embodiment, a pair of linear slide bearings 420, 420' is coupled to the base support plate 400 in a parallel spaced relationship on about opposing sides of the base support plate 400. Push rods 410, 410' extend axially through each linear bearing 420, 420'. The pushrods 410, 410' are perpendicularly coupled at one end with the platen 80X, 80Z such that a perpendicular or tangential force imposed on the platen 80X, 80Z causes the pushrods 410, 410' to axially move in relation to a displacement of the platen 80X, 80Z induced by the perpendicular or tangential force.

A sensor(s) 445 is coupled with the pushrods 410, 410' with bridge elements 430, 430'. The bridge elements 430, 430' are coupled to the pushrods 410, 410 in such a way that a non-uniform force applied upon the platen 80X, 80Z causes the sensor(s) 445 to move in an axis which parallels a longitudinal dimension of the pushrods 410, 410'. This arrangement allows precise bulge measurement of a container 500 (FIG. 5) in the intended axis to be quantified. In this inventive embodiment, the sensor(s) 445 is a linear magnetic induction sensor. A separate magnetic induction unit 440 is coupled to the base support plate 400 and provided in a parallel spaced relationship beneath the sensor(s) 445.

The sensor(s) 445 and magnetic induction unit 440 forms a magnetic linear encoding module 480 which outputs a signal having a functional relationship with an amount of displacement induced applied upon the platen 80X, 80Z by the perpendicular or tangential force.

The signal output by the sensor(s) 445 may be digital (e.g., TTL) or analog (e.g. 4-20 ma, 0-10v) as needed to achieve a particular design objective. Likewise, the type of linear encoding module 480 used to measure displacement may be changed to an optical, inductive, capacitive, or eddy current linear encoding module to achieve a particular design objective. The sensor(s) 445 is coupled to an output processing unit 570 (FIG. 5). Details of the output processing unit 570 are provided in the discussion accompanying FIG. 5. A suitable magnetic linear encoding module 480 including an output processing unit 570 is available from DRO PROS, 4992 Allison Parkway Suite G, Vacaville, Calif. 95688, www.dropros.com.

Referring to FIG. 4B, a side plan view of a sensor assembly 30Y in accordance with an inventive embodiment is depicted. In this inventive embodiment, the Y-axis sensor assembly 30Y includes a base plate 460 and an opposing top plate 450 aligned in a parallel spaced relationship maintained by two or more upright support posts 470, 470'. An upright support plate 445 is coupled to the base plate 460 generally paracentral relative to a longitudinal centerline of the Y axis sensor assembly 30Y. In this inventive embodiment, the linear slide bearing 420 is coupled to the upright support plate 445 and aligned such that the pushrod 410 extend axially through the linear bearing 420 and perpendicularly through an aperture in the top support plate 450 along the longitudinal centerline of the Y-axis sensor assembly 30Y. As discussed with respect to the X and Z axis sensor assemblies 30X, 30Z, the platen 80Y is coupled perpendicularly to an end of the pushrod 410 such that a perpendicular or tangential force imposed on the platen 80Y causes the pushrods 410 to axially move in relation to a displacement of the platen 80Y induced by the perpendicular or tangential force.

The Y-axis sensor assembly 30Y differs from the X and Z axis sensor assemblies 30X, 30Z in that a single pushrod 410 may be used and is manually positioned beneath the frame 50 to measure Y-axis bulging typically on a bottom panel 503 (FIG. 5) of a container 500 (FIG. 5). In another inventive embodiment, the Y-axis platen 80Y may have a smaller contact surface area than that of the X and Z axis platens 80X, 80Z. Other aspects of the Y-axis sensor assembly 30Y are substantially similar to the X and Z axis sensor assemblies 30X, 30Z and are not repeated here for brevity. The Y-axis sensor assembly 30Y may be considered optional in certain configurations where bulging of the bottom panel 503 is inhibited by other containers or a rigid surface (e.g., palletized stacking implementations.)

Referring to FIG. 5, a perspective view of an apparatus 100 for measuring container bulge in accordance with an inventive embodiment is depicted. In this inventive embodiment, a container 500 is maintained within the frame 50. The container 500 generally includes a polyhedral shape (e.g., cube or regular prism) which corresponds to the rectilinear aperture 40 formed by the frame 50.

The frame 50 is supported by the upright legs 345a1 (not visible), 345a2, 345b1, 345b2 (not visible), 345c1, 345c2, 345d1, 345d2 which rest upon a level horizontal planar surface 580. A load 505 is uniformly applied upon a top (upper) panel 504 of the container 500 which provides compressive force between the load 505 and the ledges 20a, 20b, 20c, 20d (FIG. 2) of the frame 50. The applied load 505 should at least be uniformly distributed across the top (upper) face of the panel 504.

The X and Z axis sensor assemblies 30X, 30Z are positioned such that their respective platens 80X, 80Z abut against upright (side) panels 501, 502 of the container 500 at about respective centroids of the upright (side) panels 501, 502. In these positions, outward deflections 510, 515 of the upright (side) panels 501, 502 causes displacement of the X and Z-axis platens 80X, 80Z measured by the X and Z-axis linear encoder modules 480 (FIG. 4A) which outputs signals to the output processing unit 570.

The Y-axis sensor assembly 30Y is within the frame 50 with the platen 80Y (not visible) abutted against at about a centroid of a bottom (lower) panel 503 (not visible). In this position, outward deflection 520 of the bottom (lower) panel 503 causes displacement of the Y-axis sensor 445 (FIG. 4B) measured by the Y-axis linear encoder module 480 (FIG. 4B) which outputs a signal to the output processing unit 570.

The X, Z and optionally Y-axis sensor assemblies 30X, 30Z, 30Y are coupled to the output processing unit 570 which converts output signals generated by the linear encoder modules 480 (FIGS. 4A, 4B) into displacement measurements. In an inventive embodiment, the output processing unit 570 may be repositionably coupled to the frame 50 with an extension arm 560. The arm 560 may be coupled to the frame 50 using the arrangements analogous to the X or Z axis sensor assemblies 30X, 30Z.

In one inventive embodiment, the output processing unit 570 is an analog device which measures changes in voltage, current and/or resistance which is output to two or more analog meters using internal metering circuits (not shown). The scales of the analog meters (not shown) may be calibrated in units of displacement.

In another inventive embodiment, the output processing unit 570 is a digital device having a processor, ASIC or VLSI circuit(s), memory and executable instructions to convert output signals received from the X, Z and optionally Y-axis sensor assemblies 30X, 30Z, 30Y into displacement measurements in engineering units. The displacement measurements may be output to a display coupled to the output processing unit 570 in a human cognizable format and/or stored in a machine readable format for archival and other purposes. Where necessary, suitable analog to digital conversion circuits may be provided to convert analog signals generated by the X, Z and optionally Y-axis sensor assemblies 30X, 30Z, 30Y into digital formats compatible with digital logic circuits employed by the output processing unit 570. The output processing unit 570 may be used to simultaneously quantify bulging of the container 500 along two or more axes as well as simultaneously quantifying bulging at multiple positions along a single axis of interest.

Figure 6:
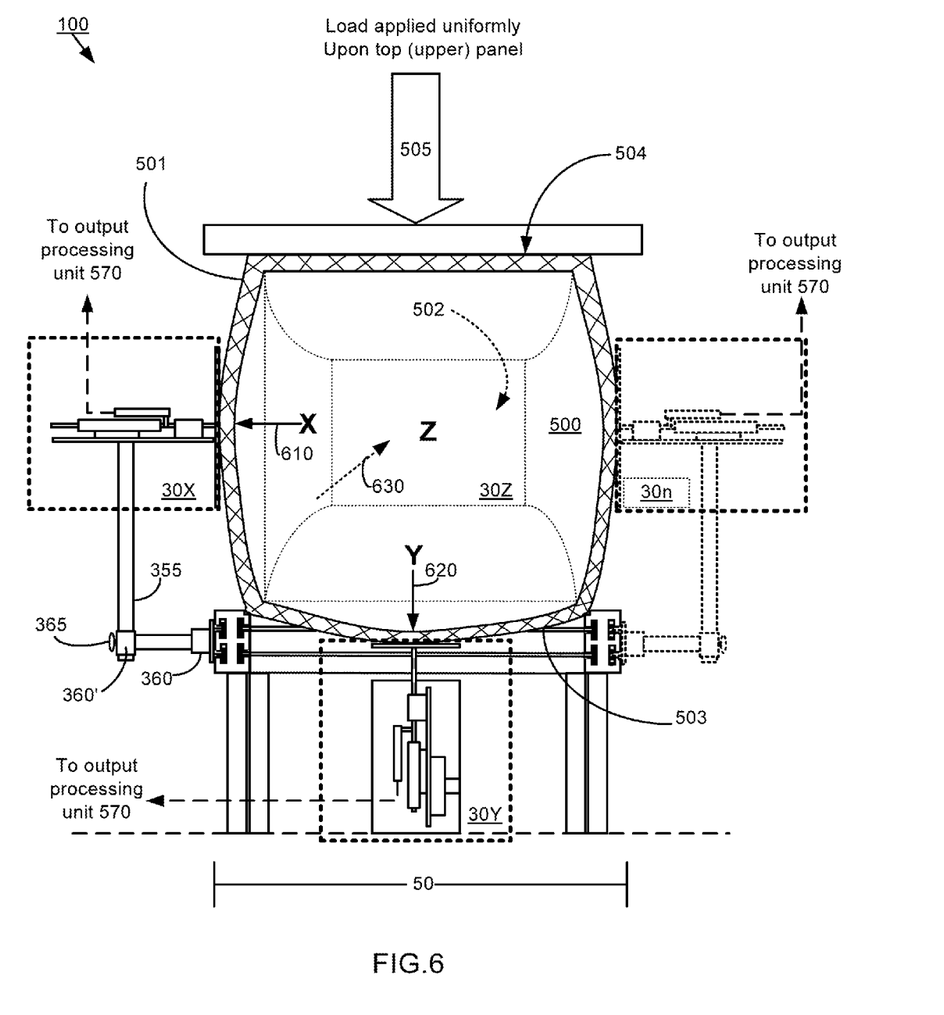
FIG. 6—depicts a cross-sectional view of a container undergoing bulge measurement in accordance with an exemplary embodiment.

Referring to FIG. 6, a cross-sectional view of a container 500 undergoing bulge measurement in accordance with an exemplary embodiment is depicted. In this inventive embodiment, a load 505 is uniformly applied upon a top (upper) panel 504 of a container 500. The load 505 causes one or panels 501, 502, 503 to deflect outward 610, 620, 630 from their respective static (unloaded) positions which is measured by one or more of the sensor assemblies 30X, 30Z, 30Y and quantified by the output processing unit 570. The amount of deflection 610, 620, 630 may be quantified using the output processing unit 570 with either a static or dynamic load 505.

For example, a static load 505 may be applied upon the container 500 to determine the bulging characteristics under a predefined load condition. Analogously, a dynamic load may be applied upon the container 500 to determine how a container responds to varying load conditions or to determine an acceptable maximum amount of bulging that a particular container 500 can successfully exhibit for a particular implementation.

As previously discussed, bulging of one or more container panels 501, 502, 503 may not be uniform in each axis and/or opposing panels. Accordingly, additional sensor assemblies 30n may be added to the frame 50 to determine how a particular container 500 responds under a particular load condition or set of load conditions.

Figure 7:
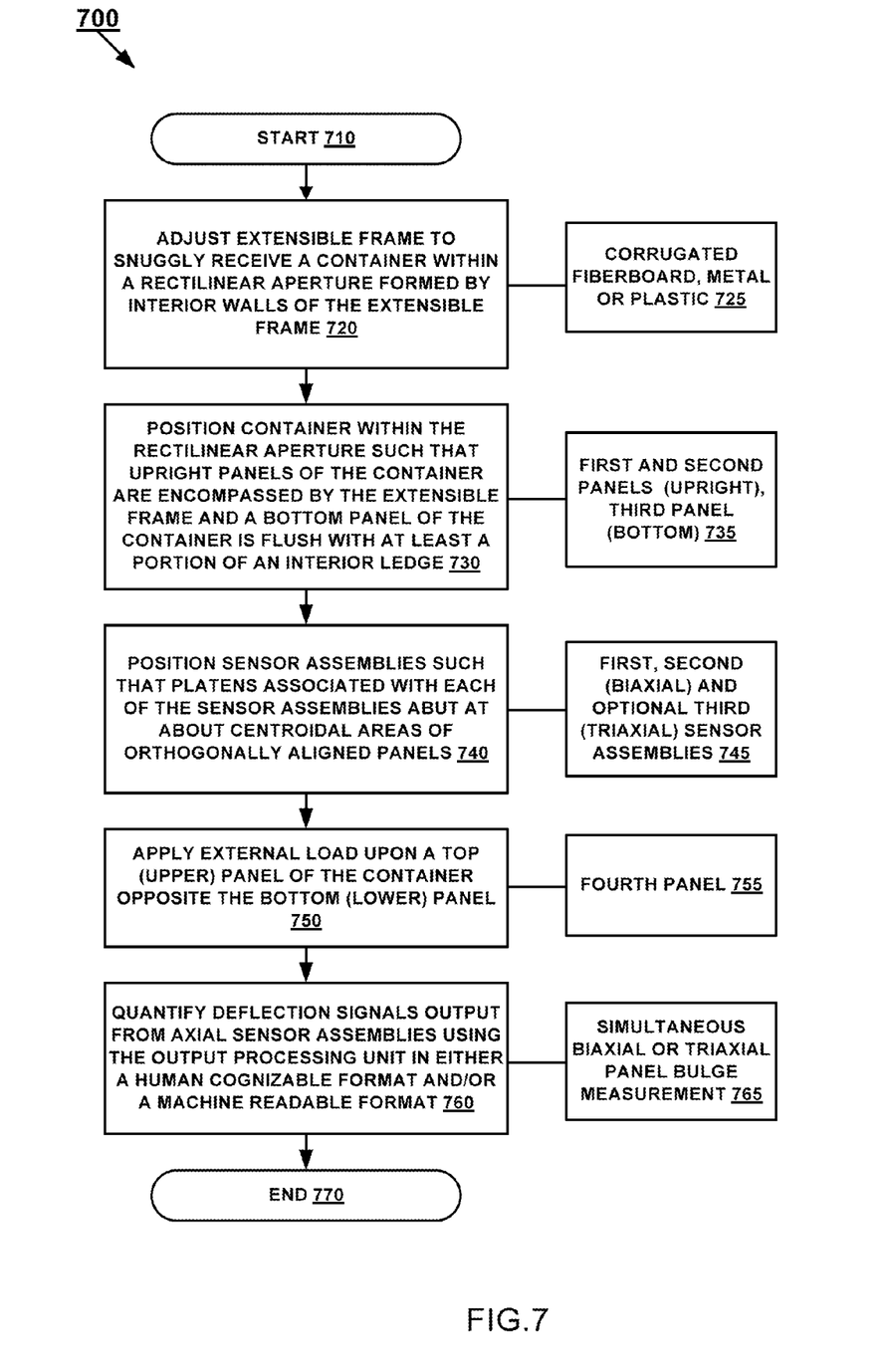
FIG. 7—depicts a method for measuring container bulge in accordance with an inventive embodiment.

Referring to FIG. 7, a method 700 for measuring container bulge in accordance with an inventive embodiment is depicted. In this inventive embodiment, the method is initiated at step 720 by adjusting the extensible frame 50 to snuggly receive a container 500 within a rectilinear aperture 40 formed by interior walls of the extensible frame 500. At block 725, the container 500 may be constructed from corrugated fiberboard, metal or plastic 725. At step 730 the container 500 is positioned within the rectilinear aperture such that upright panels 501, 502 of the container 500 are encompassed by the extensible frame 50 and a bottom panel 503 of the container 500 is flush with at least a portion of an interior ledge 20A, 20b, 20c, 20d. At block 735, the upright panels 501, 502 are sidewalls (first and second panels) of the container 500 and a third panel 503 is a bottom panel of the container 500.

At step 740, axial sensor assemblies 30X, 30Z and optionally another axial sensor 30Y are positioned such that platens 80X, 80Z and/or 80Y associated with each of the sensor assemblies abut at about centroidal areas of orthogonally aligned panels. At block 745, first and second sensor assemblies 30X, 30Z allows for biaxial bulge measurement. Adding a third sensor assembly 30Y orthogonal to the first and second sensor assemblies 30X, 30Z allows for triaxial bulge measurement. The bulge measurements are performed simultaneously along two or more axes.

At step 750, an external load 505 is uniformly applied upon a top (upper) panel 504 of the container 500 opposite the bottom (lower) panel 503. At block 755, the top (upper) panel 504 is defined as the fourth panel 504 of the container 500.

At step 760, the deflection signals output from the axial sensor assemblies 30X, 30Z and optionally 30Y are quantified using the output processing unit 570 in either a human cognizable format and/or a machine readable format. At block 765, the deflection signals are quantified simultaneously along two or more axes and represent measurements of bulge on one or more panels 501, 502, 503 of the container 500. At step 770, the method 700 ends with the completion of bulge measurements.

The various inventive embodiments described herein are intended to be merely illustrative of the principles underlying the inventive concept. It is therefore contemplated that various modifications of the disclosed embodiments will without departing from the inventive scope and spirit be apparent to persons of ordinary skill in the art. They are not intended to limit the various inventive embodiments to any precise form described. In particular, it is contemplated that the materials in which the apparatus is constructed from, placement of the various sensor assemblies, general dimensions and/or implementation sequence may be varied to accommodate a particular design objective. Accordingly, no specific limitation is intended to an particular inventive embodiment described herein. Other variations and inventive embodiments are possible in light of the above teachings, and it is not intended that the inventive scope be limited by this specification, but rather by the Claims following herein.

What is claimed:

1. An apparatus for measuring bulge of a container comprising:
    an extensible frame having an interior ledge dimensioned to maintain the container in a snug fit relationship within a rectilinear aperture formed by the extensible frame;
    a plurality of sensor assemblies coupled orthogonally to the extensible frame, the plurality of sensor assemblies in communication with centroidal areas of panels forming the container and adapted to output signals corresponding to measured deflections induced applied upon the panels by an external load applied upon the container; and,
    an output processing unit operatively coupled to the plurality of sensor assemblies for outputting the measured deflections in either a human cognizable format or a machine readable format.

2. The apparatus of claim 1 wherein the measured deflections represent bulging of the container at least at the centroidal areas of the panels.

3. The apparatus of claim 1 wherein the interior ledge is disposed along the periphery of the rectilinear aperture.

4. The apparatus of claim 1 wherein the extensible frame is extensible in at least two dimensions.

5. The apparatus of claim 4 wherein the extensible frame comprises:
    a set of beams, each of the beams being slidably coupled at about one end with a longitudinal slot of another beam aligned orthogonally to the slidably coupled beam.

6. The apparatus of claim 1 wherein each of the sensor assemblies comprise:
    a platen to abut against a panel of the container in a face-to-face relationship such that a deflection of the panel induces displacement of the platen;
    a sensor for converting the displacement of the platen into a signal readable by the output processing unit.

7. The apparatus of claim 1 wherein the container is one of; a corrugated fiberboard container, a metal container and a plastic container.

8. An apparatus for measuring bulge of a container comprising:
    an extensible frame having an interior ledge dimensioned to maintain the container in a constant geometry within a rectilinear aperture formed by the frame;
    a first repositionable sensor assembly aligned with an X-axis of the container and in communication with an approximate centroidal of a first panel of the corrugated container;
    a second repositionable sensor assembly aligned with a Y-axis of the container and in communication with an approximate centroidal area of a second panel of the container;
    a third repositionable sensor assembly aligned with a Z-axis of the container and in communication with an approximate centroidal of a third panel of the container;
    the first, second and third repositionable sensor assemblies adapted to output signals corresponding to measured deflections induced upon any of the first, second and third panels by an external load applied upon the container;
    an output processing unit operatively coupled with the first, second and third repositionable sensor assemblies for simultaneously outputting the measured deflections in either a human cognizable format or a machine readable format, the outputted measured deflections representing bulging of the container along any of the X, Y and Z-axes of thereof.

9. The apparatus of claim 8 wherein the container is a corrugated fiberboard container.

10. The apparatus of claim 8 wherein each of the first, second or third repositionable sensor assemblies comprise:
    a platen to abut against a respective first, second or third panel of the container in a face-to-face relationship such that a deflection of the respective first, second or third panel induces displacement of the platen;
    a sensor adapted to convert the displacement of the platen into a signal readable by the output processing unit.

11. The apparatus of claim 10 wherein at least two of the first, second or third repositionable sensor assemblies comprise:

a repositionable riser adapted to allow positioning of the respective first, second or third repositionable sensor assemblies in planes which parallel the respective first, second or third panels.

12. The apparatus of claim 10 wherein each of the first, second or third repositionable sensor assemblies comprise:
communicating means for communicating the displacement of the platen to the sensor.

13. The apparatus of claim 12 wherein the communicating means is a pushrod.

14. The apparatus of claim 10 wherein at least two of the first, second or third repositionable sensor assemblies further comprise:
a bracket repositionably coupled with the extensible frame and adapted to allow repositioning of the respective first, second or third sensor assemblies in planes which parallel a face of the respective first, second or third panels.

15. The apparatus of claim 8 wherein the extensible frame comprises:
a set of beams, each beam being slidably coupled at about a proximal end with a longitudinal slot of another orthogonally aligned beam;
an outer leg extending downward from about a distal end of each in a dimension which parallels the Y-axis.

16. The apparatus of claim 15 wherein each of the beams further comprise:
an inner leg coupled at about the proximal end and aligned in a parallel spaced relationship with the outer leg.

17. The apparatus of claim 8 wherein the external load is uniformly applied along the Y-axis to a fourth panel opposite the second panel such that the container is compressed between the frame and the external load.

18. The apparatus of claim 8 wherein the interior ledge spans about 0.5 inch width of the extensible frame and forms a perimeter of the rectilinear aperture.

19. An apparatus for measuring bulge of a container comprising:
an extensible frame having an interior ledge dimensioned to maintain the container in a snug fit relationship within a rectilinear aperture formed by interior walls of the extensible frame, the extensible frame formed from a set of beams, each of the beams being slidably coupled at about one end with a longitudinal slot of another beam aligned orthogonally to each slidably coupled beam;
triaxial sensor assemblies in communication at about centroidal areas of orthogonally aligned panels forming the container and adapted to output signals corresponding to measured deflections induced applied upon the panels by an external load applied upon the container; and,
output processing unit operatively coupled to the triaxial sensor assemblies for simultaneously outputting the measured deflections in either a human cognizable format or a machine readable format, the outputted measured deflections representing bulging of the container along any of the X, Y and Z axes of thereof;
wherein at least two of the triaxial sensor assemblies are repositionably coupled with the extensible frame.

20. The apparatus of claim 19 wherein each of the beams comprises:
a pair of legs disposed in a parallel spaced relationship at about proximal and distal longitudinal ends of the beams.

21. The apparatus of claim 19 wherein the container is shaped as a polyhedron.

22. The apparatus of claim 21 wherein the polyhedron is one of a cube or a regular prism.

23. A method for measuring bulge of a container using the apparatus of claim 1 comprising:
adjusting the extensible frame to snuggly receive the container within the rectilinear aperture;
disposing the container within the rectilinear aperture such that upright panels of the container are encompassed by the extensible frame and a bottom panel of the container is flush with at least a portion of the interior ledge;
applying the external load upon a top panel of the container opposite the bottom panel;
receiving the measured deflections output from the output processing unit in either a human cognizable format or a machine readable format.

24. The method of claim 23 wherein the container is one of; a corrugated fiberboard container, a metal container and a plastic container.

25. A method for measuring bulge of a container using the apparatus of claim 8 comprising:
adjusting the extensible frame to snuggly receive the container within the rectilinear aperture;
disposing the container within the rectilinear aperture such that upright panels of the container are encompassed by the extensible frame and a bottom panel of the container is flush with at least a portion of the interior ledge;
repositioning the first, second and third repositionable sensors assemblies such that platens associated with the sensor assemblies abut with the centroidal areas of the first, second and third panels respectively;
applying the external load upon a fourth panel of the container opposite the third panel;
receiving the measured deflections output from the output processing unit in either a human cognizable format or a machine readable format.

26. The method of claim 25 wherein the container is a corrugated fiberboard container.

27. A method for measuring bulge of a container using the apparatus of claim 19 comprising:
adjusting the extensible frame to snuggly receive the container within the rectilinear aperture formed by the interior walls of the extensible frame;
disposing the container within the rectilinear aperture such that upright panels of the container are encompassed by the extensible frame and a bottom panel of the container is flush with at least a portion of the interior ledge;
repositioning the triaxial sensor assemblies such that platens associated with each of the triaxial sensor assemblies abut with the centroidal areas of the orthogonally aligned panels;
applying the external load upon a top panel of the container opposite the bottom panel;
receiving the measured deflections output from the output processing unit in either a human cognizable format or a machine readable format.

28. The method of claim 27 wherein the container is a corrugated fiberboard container.

* * * * *